(12) United States Patent
Choi et al.

(10) Patent No.: US 7,835,198 B2
(45) Date of Patent: Nov. 16, 2010

(54) APPARATUS AND METHOD FOR DETECTING LEAKAGE CURRENT OF SEMICONDUCTOR MEMORY DEVICE, AND INTERNAL VOLTAGE GENERATING CIRCUIT USING THE SAME

(75) Inventors: Jun-Gi Choi, Kyoungki-do (KR); Yoon-Jae Shin, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 246 days.

(21) Appl. No.: 11/966,779

(22) Filed: Dec. 28, 2007

(65) Prior Publication Data

US 2008/0219061 A1    Sep. 11, 2008

(30) Foreign Application Priority Data

Mar. 5, 2007    (KR) .................. 10-2007-0021370

(51) Int. Cl.
    *G11C 5/14*    (2006.01)
(52) U.S. Cl. ................... 365/189.09; 365/149
(58) Field of Classification Search ............ 365/189.09, 365/149, 189.11; 327/537
    See application file for complete search history.

(56) References Cited

U.S. PATENT DOCUMENTS

| | | | |
|---|---|---|---|
| 5,886,932 A * | 3/1999 | Choi .................. | 365/189.09 |
| 5,920,226 A * | 7/1999 | Mimura ................ | 327/537 |
| 6,222,787 B1 | 4/2001 | Yoon et al. | |
| 6,862,239 B1 * | 3/2005 | Huang et al. ........... | 365/222 |
| 7,009,904 B2 * | 3/2006 | Kim ................... | 365/211 |
| 7,046,074 B2 | 5/2006 | Jang | |
| 7,102,936 B2 | 9/2006 | Kim et al. | |
| 2004/0155701 A1 | 8/2004 | Kim et al. | |
| 2006/0221749 A1 | 10/2006 | Kwean | |
| 2007/0001752 A1 | 1/2007 | Jin | |

FOREIGN PATENT DOCUMENTS

| | | |
|---|---|---|
| JP | 05205465 | 8/1993 |
| JP | 08-203269 | 8/1996 |
| JP | 2006-190435 | 7/2006 |
| JP | 2006-190436 | 7/2006 |
| KR | 100193103 | 2/1999 |

(Continued)

OTHER PUBLICATIONS

Notice of Preliminary Rejection issued from the Korean Intellectual Property Office on Feb. 28, 2008 with an English translation.

(Continued)

*Primary Examiner*—Vu A Le
(74) *Attorney, Agent, or Firm*—IP & T Group LLP

(57) ABSTRACT

A semiconductor memory device is capable of generating a back bias voltage based on a target level changed according to a leakage current of the semiconductor memory devices, thereby minimizing the amount of the leakage current. The semiconductor memory device includes a leakage current detector and a back bias voltage generator. The leakage current detector is configured to detect a leakage current of a cell array. The back bias voltage generator is configured to generate a back bias voltage having a target level changed according to the leakage current.

25 Claims, 6 Drawing Sheets

FOREIGN PATENT DOCUMENTS

| | | |
|---|---|---|
| KR | 102000000877 A | 2/2000 |
| KR | 100263529 | 5/2000 |
| KR | 102000004247 A | 7/2000 |
| KR | 10-2000-0075605 | 12/2000 |
| KR | 102001000401 A | 1/2001 |
| KR | 102001000526 A | 1/2001 |
| KR | 102003000265 A | 1/2003 |
| KR | 10-2006-0007758 | 1/2006 |

OTHER PUBLICATIONS

Notice of Preliminary Rejection issued from Korean Intellectual Property Office on May 11, 2010.

Filed Examiner's Answer to Appeal Brief with the Patent Court of Korea on Oct. 13, 2009.

Filed Examiner's Answer to Reply Brief with the Patent Court of Korea on Jan. 6, 2010.

Yoo, "Dram Design," Hongrung Publishing Company, 1996, pp. 6-7 and pp. 208-211.

* cited by examiner

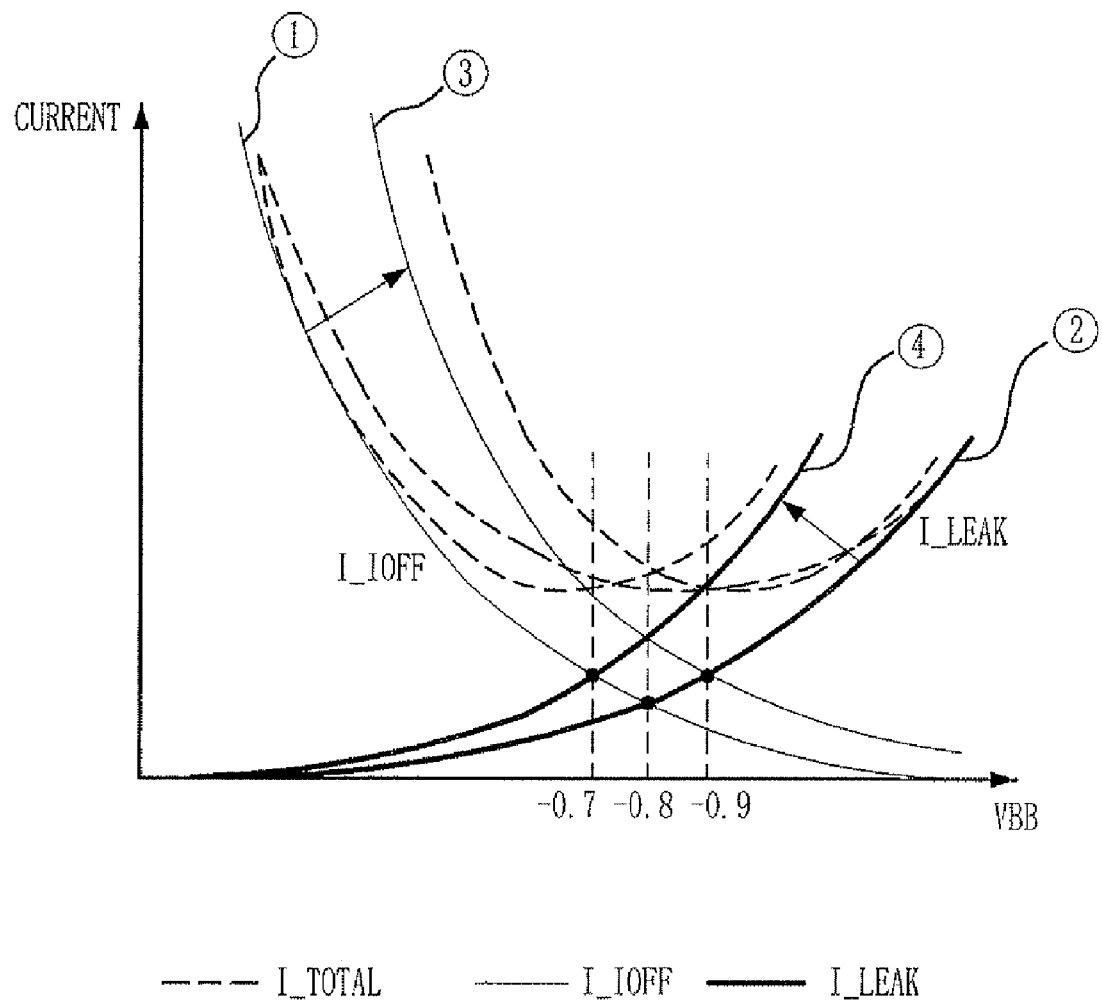

APPARATUS AND METHOD FOR DETECTING LEAKAGE CURRENT OF SEMICONDUCTOR MEMORY DEVICE, AND INTERNAL VOLTAGE GENERATING CIRCUIT USING THE SAME

CROSS-REFERENCE TO RELATED APPLICATIONS

The present application claims priority to Korean patent application number. 10-2007-0021370, filed on Mar. 5, 2007, which is incorporated by reference in its entirety.

BACKGROUND OF THE INVENTION

The present invention relates to a semiconductor design technology, and more particularly to a leakage current deterring circuit and internal voltage generating circuit using the same semiconductor memory device. The internal voltage generating circuit is capable of generating a back bias voltage based on a target level changed according to a leakage current of the semiconductor memory device.

Semiconductor memory devices such as a dynamic random access memory (DRAM) use a capacitor as a unit element for storing data, which is called a cell.

In order to store a logic high level of data '1', a relatively high level of voltage is provided to the cell and a high level of potential is maintained in the cell. On the contrary, a relatively low level of voltage is provided to the cell, maintaining a low level of potential in the cell for storing a logic low level of data '0'.

Each cell of the semiconductor memory device further includes a MOS transistor connected to the capacitor. The MOS transistor performing a switching operation. That is, when the MOS transistor turns on, the corresponding cell is coupled to a bit line and potential corresponding to data stored in the cell is shared to a bit line.

When the MOS transistor turns off the cell is disconnected to the bit line and potential of the cell is stored as data. In case that the capacitor provided in the cell is ideal, the potential, i.e., charge, is maintained to a constant level. However, an actual capacitor loses the stored charge due to a leakage current with time. Accordingly, it cannot be distinguished whether the stored data is in a logic high level or a logic low level. In regard to the kind and cause of the leakage current, it will be described below in detail.

FIG. 1 illustrates a cross-sectional view of a transistor provided in a semiconductor memory device such as a DRAM, which shows a leakage current generally caused in the DRAM.

Referring to FIG. 1, as mentioned above, it is a cross-sectional view of a NMOS transistor connected to a plurality of cells in the DRAM for operating as a switch. The NMOS transistor is composed of a source, a drain and a gate. The source and drain are metallic contact terminals connected to an N-type semiconductor. The gate, which is also a metallic contact terminal, is coupled to a substrate through an isolating material. The substrate is a P-type semiconductor and is connected to a well bias, which is another metallic contact terminal. Generally, in such NMOS transistors, the drain is connected to the cell; the gate is connected to a word line; and the source is connected to a bit line.

Accordingly, when the word line is activated, the gate is supplied with a boosted voltage VPP. That is, the NMOS transistor turns on. A channel is formed on the substrate and the cell connected to the drain is coupled to the bit line connected to the source. Therefore, the drain and source each have an identical level of voltage as each other, i.e., a core voltage VCORE or a ground voltage VSS.

On the contrary, when the word line is inactivated, the gate is supplied with the ground voltage VSS. That is, the NMOS transistor turns off. The channel disappears on the substrate and the cell is disconnected to the bit line. The drain is supplied with a voltage stored in the cell and the source is supplied with a bit line precharge voltage VBLP generated by a precharge operation. If the voltage stored in the cell is relatively high level, the core voltage VCORE is supplied to the drain. If the voltage stored in the cell is relatively low level, the ground voltage VSS is supplied to the drain.

Among the above mentioned conditions of the NMOS transistor, there is a leakage current in case that the NMOS transistor turns off. The leakage current is classified into an off leakage current I_IOFF and a junction leakage current I_LEAK which are caused in case that the NMOS transistor turns off and the core voltage VCORE is supplied to the drain. The off leakage current I_IOFF is a current generated between the drain supplied with the core voltage VCORE and the source supplied with the bit line precharge voltage VBLP. The junction leakage current I_LEAK is a current generated between the drain supplied with the core voltage VCORE and the substrate supplied with the back bias voltage VBB.

Accordingly, a total leakage current I_TOTAL caused in the cells of the DRAM is the sum of the off leakage currents I_IOFF and the junction leakage currents I_LEAK.

Herein, the off leakage current I_IOFF is generated by level difference between the core voltage VCORE and the bit line precharge voltage VBLP, generally the core voltage VCORE being twice as high as the bit line precharge voltage VBLP. The gate width has also an effect on the amount of the off leakage current I_IOFF.

The junction leakage current I_LEAK is a kind of reverse saturation current. It is generated because the drain is an N-type material and the substrate is a P-type. The amount of the junction leakage current I_LEAK is negligible compared with the off leakage current I_IOFF.

Therefore, in order to reduce the total leakage current I_TOTAL caused in the plurality of cells of the DRAM, it is more effective to reduce the off leakage current I_IOFF than the junction leakage current I_LEAK.

As described above, the gate width has an effect on the amount of the off leakage current I_IOFF. The off leakage current I_IOFF is in inverse proportion to the size of the gate with. It may be considered lengthening the gate width of the NMOS transistor to reduce the off leakage current I_IOFF. However, it is not consistent with the trend whereby DRAM is being integrated and reduced in size more and more.

Another method is used where a back bias voltage VBB that is lower than a ground voltage VSS is supplied to the substrate of the NMOS transistor. The off leakage current I_IOFF can be reduced by increasing the amount of charges in a depletion layer, the depletion layer being formed in a substrate region between the drain and the source. This method is used in most of the DRAM for the integration and the miniaturization because it can reduce the off leakage current I_IOFF without increasing the size of the DRAM.

As the back bias voltage VBB applied to the substrate increases more in a negative direction of which level is lower than the ground voltage VSS, the amount of charges in the depletion layer increases more. In addition, the junction leakage current I_LEAK increases in proportion to the amount of charges. The reason is that the junction leakage current I_LEAK is a reverse saturation current which has a characteristic to increase in proportion as the amount of charges in the depletion layer increases.

Accordingly, the junction leakage current I_LEAK, which has almost a zero value when the back bias voltage VBB is close to the ground voltage VSS, increases as the back bias voltage increases in the negative direction. After a given time, the junction leakage current I_LEAK becomes bigger than the off leakage current I_IOFF which decrease according to the level of the back bias voltage VBB. After all it causes such a problem that the total leakage current I_TOTAL increases by the back bias voltage VBB which is for reducing the total leakage current I_TOTAL.

FIG. 2 is a graph illustrating the interrelation between the back bias voltage and the leakage current in the DRAM.

Referring to FIG. 2, it is illustrated how the off leakage current I_IOFF and the junction leakage current I_LEAK change according to a level change of the back bias voltage VBB applied to the general DRAM.

At the time when the back bias voltage VBB is close to the ground voltage VSS, the off leakage current I_IOFF has a relatively big value and the junction leakage current I_LEAK has a very small value which is almost a zero. Thereafter, as the back bias voltage VBB increases in the negative direction, the off leakage current I_IOFF decreases and the junction current I_LEAL gradually increases. However, the total leakage current I_TOTAL decreases in period of ① because the decreasing width of the off leakage current I_IOFF is bigger than the increasing width of the junction leakage current I_LEAK.

When the back bias voltage become a predetermined level, the increasing junction leakage current I_LEAK and decreasing off leakage current I_IOFF become identical to each other. Starting from the point ②, the levels of the junction leakage current I_LEAK and the off leakage current I_IOFF are reversed. That is, the total leakage current I_TOTAL of the DRAM, which has decreased according to the decreasing back bias voltage VBB, begins to increase.

If the back bias voltage VBB continuously increases in the negative direction thereafter, the total leakage current I_TOTAL increases accordingly more and more, referring to the period of ③. In order that the total leakage current I_TOTAL has the smallest value, the level of the back bias voltage VBB should be the level when the levels of the junction leakage current I_LEAK and the off leakage current I_IOFF are reversed However, even if manufactured through the same process, the DRAMs do not have the identical characteristics due to the various environmental factors. That is, in each of the DRAMs generated through the same process, the level of the back bias voltage to make the total leakage current I_TOTAL have the smallest value may be different, but generally it is determined between the level of −0.7 voltage and the level of −0.9 voltage. After all, it is most important to generate an appropriate back bias voltage VBB in order to reduce the total leakage current I_TOTAL of the DRAM.

FIG. 3 is a block diagram of a conventional back bias voltage generator. Referring to the FIG. 3, the back bias voltage generator 300 includes back bias voltage detector 302 and a voltage generator 304.

The back bias voltage detector 302 generates a detecting signal VBB_DET according to the level of the back bias voltage VBB. The voltage generator 304 generates the back bias voltage VBB in response to the detecting signal VBB_DET.

Herein, the voltage generator 304 includes an oscillating unit 3042 and a pumping unit 3044. The oscillating unit 3042 generates an oscillating signal OSC, which is toggled in a period determined according to the detecting signal VBB_DET. The pumping unit 3044 generates the back bias voltage VBB by pumping charges in response to the oscillation signal OSC.

The operation of the conventional back bias voltage generator will be described below based on the above configuration.

The back bias voltage detector 302 compares the level of the back bias voltage VBB with a target level and determines the level of the detecting signal DET_VBB according to the comparison result. And then, the oscillating unit 3042 generates an oscillating signal OSC that is toggled in a period determined according to the level of the detecting signal VBB_DET. The pumping unit 3044 pumps the charges in response to toggling of the oscillating signal OSC, to thereby generate the back bias voltage VBB.

For example, when the back bias voltage VBB is higher than the target level, the back bias voltage detector 302 outputs the detecting signal VBB_DET in a logic high level. Accordingly, the oscillating unit 3042 generates the oscillating signal OSC toggled in a predetermined period. The pumping unit 3044 pumps the charges in response to toggling of the oscillating signal OSC, to thereby decrease the back bias voltage to have the target level.

FIG. 4 is a schematic circuit diagram of the back bias voltage detector described in FIG. 3.

Referring to FIG. 4, the back bias voltage detector 302 includes PMOS transistors and an inverter. First and second PMOS transistors P1 and P2 are connected in series between a core voltage VCORE terminal and a ground voltage VSS terminal. The inverter INV drives a voltage on a connection node DET of the first and second MOS transistors P1 and P2 to thereby generate the detecting signal VBB_DET.

Herein, the first PMOS transistor P1 controls to connect the core voltage VCORE terminal and the connection node DET, which are respectively connected to a source and a drain thereof, in response to the ground voltage VSS received from a gate thereof. The second PMOS transistor P2 controls to connect the connection node DET and the ground voltage VSS terminal, which are respectively connected to a source and a drain thereof, in response to the back bias voltage VBB received from a gate thereof.

The operation of the back bias voltage detector 302 will be described below based on the above configuration.

Based on a resistance of the first PMOS transistor P1 which is determined by the ground voltage VSS, a voltage level on the connection node DET is determined in response to a resistance of the second PMOS transistor P2 which changes according to the back bias voltage VBB. The voltage on the connection node DET is driven to a logic high or low level based on a logic threshold voltage level of the inverter INV and outputted as the detecting signal VBB_DET.

For example, when the back bias voltage VBB increases in a negative direction of which level is lower than the ground voltage VSS, the resistance of the second PMOS transistor P2 decreases. Accordingly, the voltage on the connection node DET decreases. When the voltage on the connection node DET becomes lower than the logic threshold voltage level of the inverter INV, the inverter INV outputs the detecting signal VBB_DET in a logic high level.

Accordingly, the conventional back bias voltage detector 302 can change the target level of the back bias voltage VBB by changing the sizes of the first and second PMOS transistors P1 and P2. After the target level is firstly determined, the sizes of the first and second PMOS transistors P1 and P2 are controlled to make a transition of the logic level of the detecting signal VBB_DET at the timing corresponding to the determined target level.

However, after the sizes of the first and second PMOS transistors P1 and P2 are determined once at the design stage, the conventional back bias voltage detector 302 cannot change the target level. Accordingly, a plurality of DRAMs should have an identical target level.

That is, the level of the back bias voltage wherein the least total leakage current I_TOTAL is caused in some of the DRAMs generated through the process is determined as the target level. The target level is applied to all of the DRAMs generated through the process in the lump.

Through the conventional method, the determined back bias voltage VBB makes the total leakage current I_TOTAL at the smallest level in some of the DRAMs. However, in the other DRAMs, the total leakage current I_TOTAL may reach to the smallest level or not at the determined back bias voltage VBB. In that case, the amount of the loss of cell charges increases by the leakage current generated in a standby state. The refresh period of the DRAMs is reduced, thereby causing problems such as a refresh fail.

SUMMARY OF THE INVENTION

Embodiments of the invention are directed to providing a semiconductor memory device capable of generating a back bias voltage based on a target level changed according to a leakage current of the semiconductor memory devices, thereby minimizing the amount of the leakage current.

Also, embodiments of the invention are directed to providing a detecting circuit for detecting off and junction leakage currents, thereby generating a voltage the level of which changes according to the detection result and a back bias voltage generating circuit for generating a back bias voltage with a target level changed in response to an external signal.

In one embodiment, a semiconductor memory device includes a leakage current detector configured to detect a leakage current of a cell array, and a back bias voltage generator configured to generate a back bias voltage having a target level changed according to the leakage current.

In another embodiment, a semiconductor memory device includes an off leakage current detector configured to detect off leakage currents generated in a cell array and to generate a first detection voltage corresponding to a detection result, a junction leakage current detector configured to detect junction leakage currents generated in the cell array and to generate a second detection voltage corresponding to a detection result, a voltage comparator configured to compare the first detection voltage with the second detection voltage, and a back bias voltage generator for generating a back bias voltage with a target level changed according to a comparison result of the voltage comparator.

In further embodiment, a method for driving a semiconductor memory device includes detecting an off leakage current and a junction leakage current generated in a cell array, and generating a back bias voltage using a target level changed according to a detection result of at least one of the off leakage current and the junction leakage current.

BRIEF DESCRIPTION OF THE DRAWINGS

FIG. 9 is a graph illustrating the interrelation between a back bias voltage and a leakage current in the DRAM in accordance with an embodiment of the invention.

DESCRIPTION OF SPECIFIC EMBODIMENTS

Hereinafter, a semiconductor memory device in accordance with the invention will be described in detail referring to the accompanying drawings.

Figure 1:
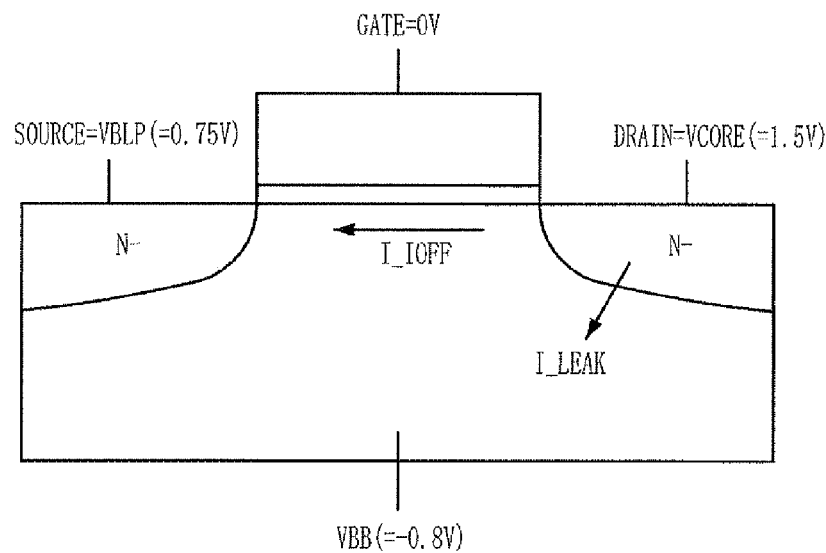
FIG. 1 illustrates a cross-sectional view of a transistor provided in a semiconductor memory device such as a DRAM, which shows a leakage current generally caused in the DRAM.
Figure 2:
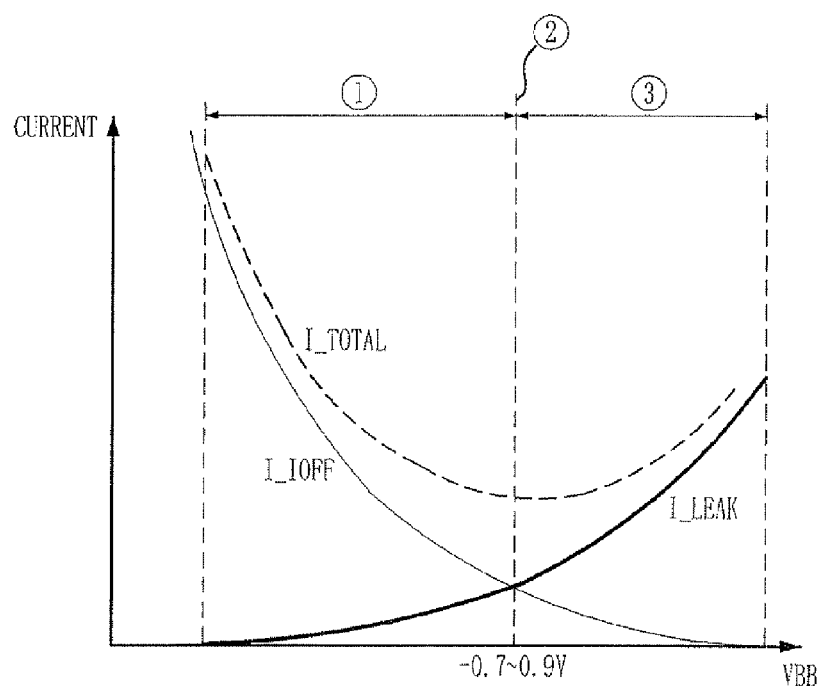
FIG. 2 is a graph illustrating the interrelation between a back bias voltage and a leakage current in the DRAM.
Figure 3:
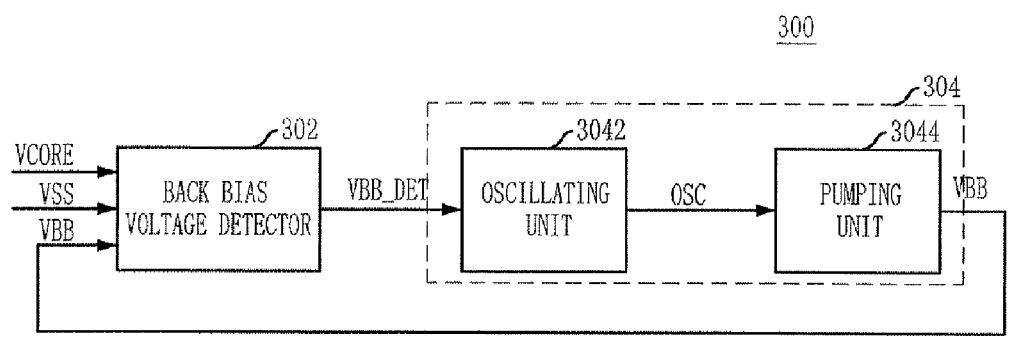
FIG. 3 is a block diagram of a conventional back bias voltage generator.
Figure 4:
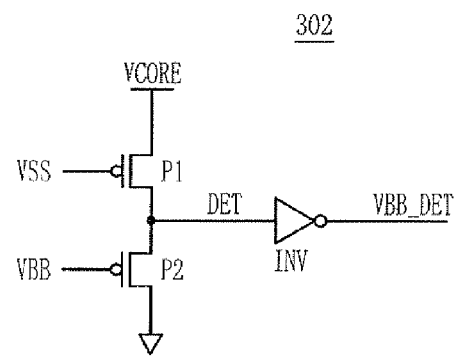
FIG. 4 is a schematic circuit diagram of a back bias voltage detector described in FIG. 3.
Figure 5:
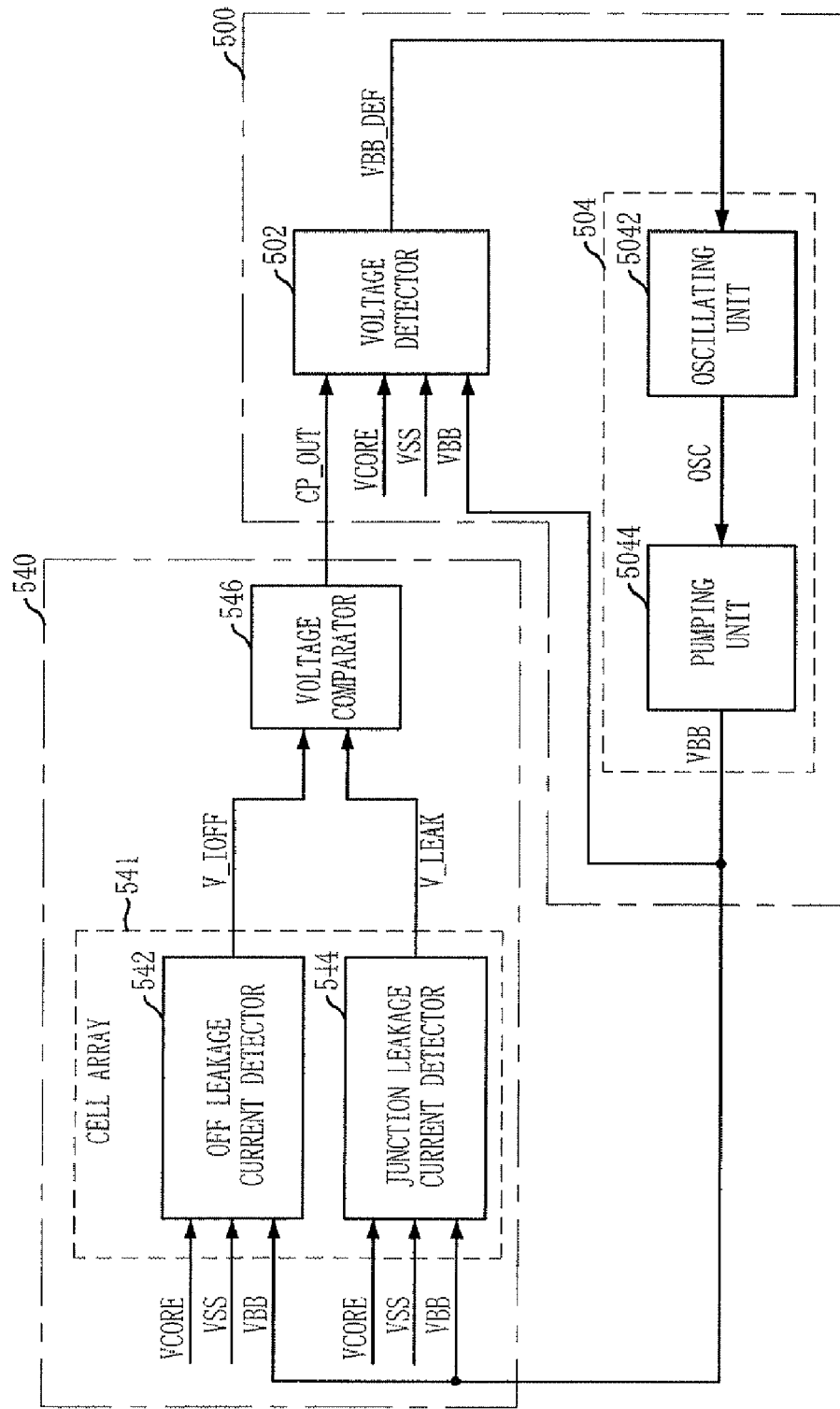
FIG. 5 is a block diagram of a semiconductor memory device in accordance with an embodiment of the invention.

FIG. 5 is a block diagram of a semiconductor memory device in accordance with the embodiment of the invention.

Referring to FIG. 5, the semiconductor memory device includes a leakage current detector 540 and a back bias voltage generator 500. The leakage current detector 540 detects an off leakage current and a junction leakage current. The back bias voltage generator 500 changes a target level of generating a back bias voltage VBB according to the detection result of the leakage current detector 540.

The leakage current detector 540 includes an off leakage current detector 542, a junction leakage current detector 544 and a voltage comparator 546. The off leakage current detector 542 detects an off leakage current generated a cell array 541 and generates a first detection voltage V_IOFF corresponding to the detection result. The junction leakage current detector 544 detects a junction leakage current generated the cell array 541 and generates a second detection voltage V_LEAK corresponding to the detection result. The voltage comparator 546 compares the first detection voltage V_IOFF with the second detection voltage V_LEAK and generates a comparison voltage CP_OUT corresponding to the comparison result.

The back bias voltage generator 500 includes a voltage detector 502 and a voltage generator 504. The voltage detector 502 detects the back bias voltage VBB while changing the target level according to the level of the comparison voltage CP_OUT. The voltage generator 504 generates the back bias voltage VBB in response to a detecting signal VBB_DET outputted from the voltage detector 502.

The voltage generator 504 includes an oscillating unit 5042 and a pumping unit 5044. The oscillating unit 5042 generates an oscillating signal OSC toggled in a period determined according to the detecting signal VBB_DET. The pumping unit 5044 generates the back bias voltage VBB by pumping charges in response to the oscillating signal OSC.

An operation of the semiconductor memory device in accordance with the embodiment will be described below based on the above configuration.

The off leakage current detector 542 and the junction leakage current detector 544 detect the off leakage current and the junction leakage current respectively, which are generated at a standby state in the cell array 541 of the DRAM. The off leakage current detector 542 and the junction leakage current detector 544 generate the first detection voltage V_IOFF and the second detection voltage V_LEAK corresponding to the detecting results respectively.

The off leakage current detector 542 and the junction leakage current detector 544 detect the leakage current in cell transistors provided in the cell array 541 at the same time. However, the off leakage current detector 542 and the junction leakage current detector 544 do not operate in an identical cell transistor at the same time.

The voltage comparator 546 compares the first and second detection voltage V_IOFF and V_LEAK and changes the level of the comparison voltage CP_OUT accordingly.

For example, when the first detection voltage V_IOFF is greater than the second detection voltage V_LEAK, the voltage comparator 546 increases the comparison voltage CP_OUT by a level difference. On the contrary, when the first detection voltage V_IOFF is less than the second detection voltage V_LEAK, the comparison voltage CP_OUT decreases by a level difference.

The voltage detector 502 compares the level of the back bias voltage VBB with the target level and determines the level of detecting signal DET_VBB according to the comparing result. The target level changes according to the level of the comparison voltage CP_OUT.

The oscillating unit 5042 generates an oscillating signal OSC toggled in a period determined according to the detecting signal VBB_DET. The pumping unit 5044 generates the back bias voltage VBB by pumping charges in response to toggling of the oscillating signal OSC.

For example, when the back bias voltage VBB is greater than the target level corresponding to the comparison voltage CP_OUT, the voltage detector 502 outputs the detecting signal DET_VBB in a logic high level. The oscillating unit 5042 generates the oscillating signal OSC toggled in a period determined accordingly. The pumping unit 5044 performs a pumping operation in response to the toggling of the oscillating signal OSC to thereby decrease the back bias voltage VBB, resulting in the back bias voltage VBB being at the target level.

As described above, the back bias voltage VBB is adjusted at the target level corresponding to the comparison voltage CP_OUT. That is, the back bias voltage VBB changes in response to the comparison voltage CP_OUT, which is determined according to the amount of a total leakage current I_TOTAL of the DRAM. Accordingly, the back bias voltage VBB is determined according to the amount of the total leakage current I_TOTAL of the DRAM.

Figure 6:
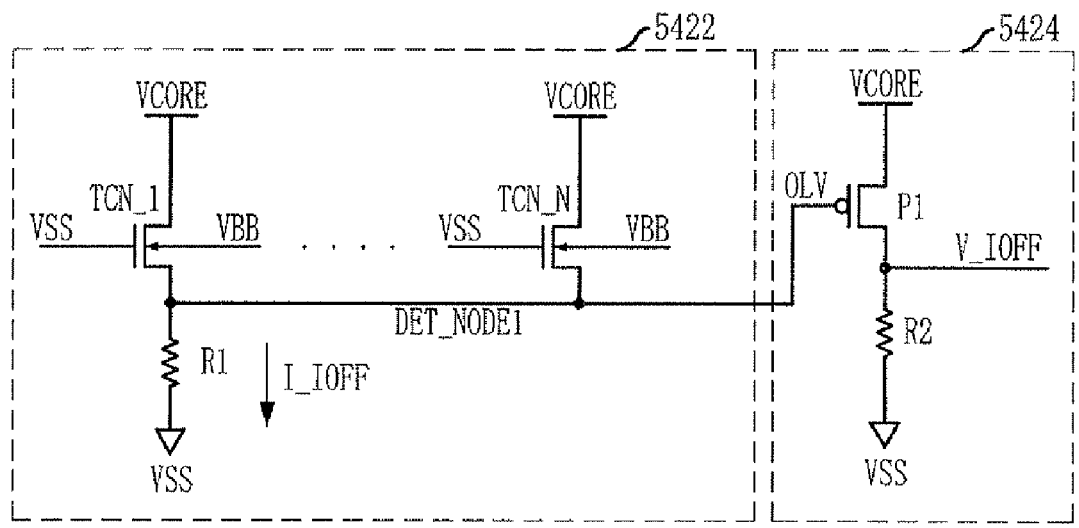
FIG. 6 is a schematic circuit diagram of an off leakage current detector described in FIG. 5.

FIG. 6 is a schematic circuit diagram of the off leakage current detector described in FIG. 5.

Referring to FIG. 6, the off leakage current detector 542 includes an off leakage voltage generating unit 5422 and a buffering unit 5424. The off leakage voltage generating unit 5422 generates an off leakage voltage OLV of which level corresponds to the sum of off leakage currents, the off leakage currents being generated in a plurality of cell transistors TCN_1 to TCN_N of the cell array 541 respectively. The buffering unit 5424 buffers the off leakage voltage OLV and outputs the first detection voltage V_IOFF.

The off leakage voltage generating unit 5422 includes a first resistor R1 connected between sources of the plurality of cell transistors TCN_1 to TCN_N and a ground voltage VSS terminal. At the standby state, the off leakage voltage generating unit 5422 outputs the off leakage voltage OLV through a detection node DET_NODE1 which is a connection node of the sources of the plurality of cell transistors TCN_1 to TCN_N and the first resistor R1.

Herein, in the plurality of cell transistors TCN_1 to TCN_N, a drain is provided with a core voltage VCORE, a gate is provided with a ground voltage VSS and a well bias is provided with the back bias voltage VBB at the standby state.

The buffering unit 5424 includes a PMOS transistor P1 and a second resistor R2. The PMOS transistor P1 controls to connect the core voltage VCORE terminal and a first detection voltage terminal, which are respectively connected to a source and a drain thereof, in response to the off leakage voltage OLV received from a gate thereof. The second resistor R2 is connected between the first detection voltage terminal and the ground voltage VSS.

An operation of the off leakage current detector 542 in accordance with the embodiment will be described below based on the above configuration.

Above all, the plurality of cell transistors TCN_1 to TCN_N are composed of cell transistors actually provided in the cell array 541, which are assigned to the off leakage current detector 542 to detect the off leakage current I_IOFF. Accordingly, the plurality of cell transistors TCN_1 to TCN_N each have the drain connected to a capacitor, i.e., a cell of the DRAM, and the gate connected to a word line. However, the sources of the cell transistors TCN_1 to TCN_N are connected to the off leakage current detector 542 instead of a bit line in order to detect the off leakage current I_IOFF.

In addition, each capacitor connected to the drain is intendedly supplied with the core voltage VCORE during the standby state for an accurate detection of the off leakage current I_IOFF. That is, a high level of potential is stored in the capacitor. The word line connected to the gate is supplied with the ground voltage VSS and a well bias of each cell transistor is supplied with the back bias voltage VBB intendedly. Consequently, the conditions such that the off leakage current is generated in the cell transistors TCN_1 to TCN_N is intendedly made.

In theses conditions, the off leakage current is generated by a voltage difference between a drain and a source in each cell transistor. The sum of the off leakage current in each cell transistor is applied to the detection node DET_NODE1. Through the first resistor R1 configured between the detection node DET_NODE1 and the ground voltage VSS terminal, the off leakage voltage OLV is generated in response to the sum of the off leakage current I_IOFF and transferred to the buffering unit 5424.

The buffering unit 5424 includes the PMOS transistor P1 of which resistance is determine in response to the off leakage voltage OLV and the second resistor R2 having a predetermined resistance. The first detection voltage V_IOFF is outputted at a connection node of the PMOS transistor and the second resistor R2.

As described above, the off leakage current detector 542 detects the off leakage current I_IOFF and generates the first detection voltage V_IOFF of which level is determined in response to a detection result.

Figure 7:
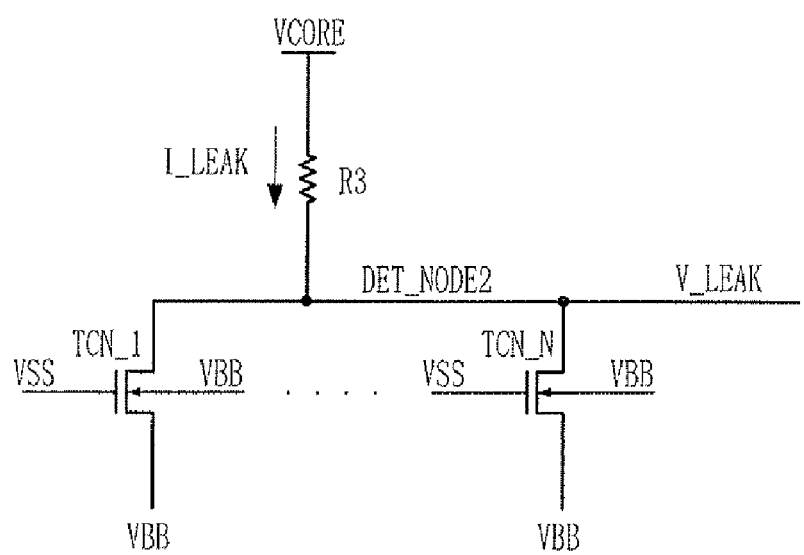
FIG. 7 is a schematic circuit diagram of a junction leakage current detector described in FIG. 5.

FIG. 7 is a schematic circuit diagram of the junction leakage current detector described in FIG. 5.

Referring to FIG. 7, the junction leakage current detector 544 generates the second detection voltage I_LEAK of which level corresponds to the sum of junction leakage currents, the junction leakage currents being generated in the plurality of cell transistors TCN_1 to TCN_N of the cell array 541 respectively.

The junction leakage current detector 544 includes a third resistor R3 connected between drains of the plurality of cell transistors TCN_1 to TCN_N and a core voltage VCORE terminal. At the standby state, the junction leakage current detector 544 outputs the second detection voltage V_LEAK through a detection node DET_NODE2 which is a connection node of the drains of the plurality of cell transistors TCN_1 to TCN_N and the third resistor R3.

Herein, in the plurality of cell transistors TCN_1 to TCN_N, a source is provided with the back bias voltage VBB, a gate is provided with the ground voltage VSS and a well bias is provided with the back bias voltage VBB at the standby state.

An operation of the junction leakage current detector 544 in accordance with the embodiment will be described below based on the above configuration.

Above all, the plurality of cell transistors TCN_1 to TCN_N are also composed of cell transistors actually provided in the cell array 541, which are assigned to the junction leakage current detector 544 to detect the junction leakage current I_LEAK. Accordingly, the plurality of cell transistors TCN_1 to TCN_N each have the source connected to the bit line and the gate connected to the word line. However, the drains of the cell transistors TCN_1 to TCN_N are connected to the junction leakage current detector 544 instead of the capacitor used as the cell of the DRAM in order to detect the junction leakage current I_LEAK.

In addition, the word line connected to the gate is supplied with the ground voltage VSS, and the bit line connected to the source and the well bias of each cell transistor are supplied with the back bias voltage VBB intendedly during the standby state for an accurate detection of the junction leakage current I_LEAK. Consequently, the conditions such that the junction leakage current is generated in the cell transistors TCN_1 to TCN_N is intendedly made.

In theses conditions, the junction leakage current is generated by an N-type drain and a P-type substrate in each cell transistor. The sum of the junction leakage current in each cell transistor is applied to the detection node DET_NODE2. Through the third resistor R3 configured between the detection node DET_NODE2 and a core voltage VCORE terminal, the second detection voltage V_LEAK is generated in response to the sum of the junction leakage current I_LEAK.

Through the above operation, the junction leakage current detector 544 detects the junction leakage current I_LEAK and generates the second detection voltage V_LEAK of which level is determined in response to a detection result.

Figure 8:
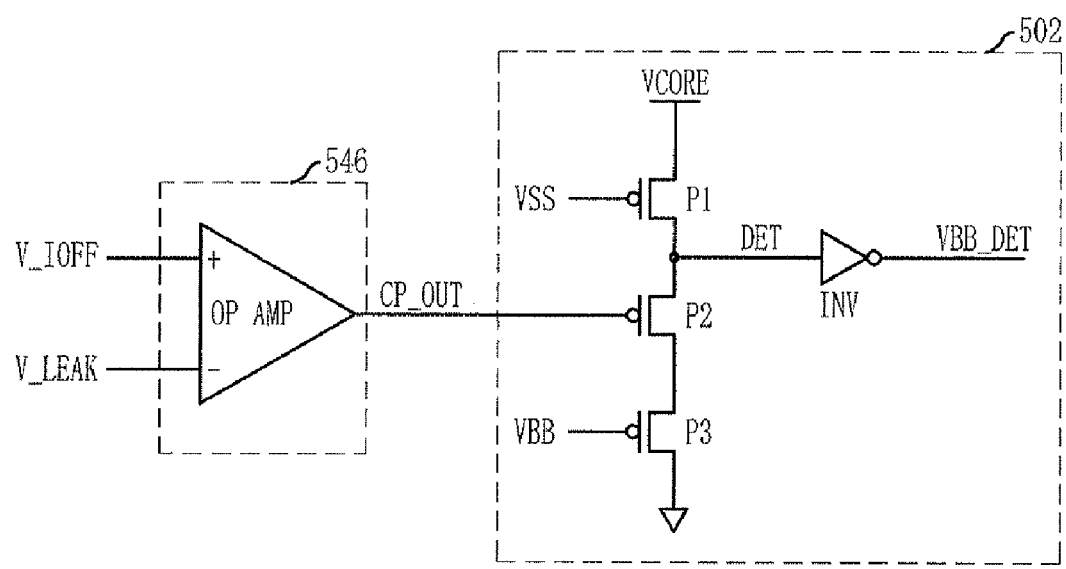
FIG. 8 is a schematic circuit diagram of a voltage comparator and a voltage detector described in FIG. 5.

FIG. 8 is a schematic circuit diagram of the voltage comparator and the voltage detector described in FIG. 5.

Referring to FIG. 8, the voltage comparator 546 includes an operational amplifier for comparing the first detection voltage V_IOFF with the second detecting voltage V_LEAK to thereby output comparison voltage CP_OUT of which level is determined in response to a comparing result.

The voltage detector 502 includes PMOS transistors and an inverter. The PMOS transistors P1 to P3 are connected between the core voltage VCORE terminal and the ground voltage VSS terminal. The inverter INV drives a voltage applied to a connection node DET of the first and second PMOS transistors P1 and P2 to thereby output the detecting signal VBB_DET.

The first PMOS transistor P1 controls to connect the core voltage VCORE terminal and the connection node DET, which are respectively connected to a source and a drain thereof, in response to the ground voltage VSS received from a gate thereof. The second PMOS transistor P2 controls to connect the connection node DET and a source of the third PMOS transistor P3, which are respectively connected to a source and a drain thereof, in response to the comparison voltage CP_OUT received from a gate thereof. The third PMOS transistor P3 controls to connect the drain of the second PMOS transistor P2 and the ground voltage VSS terminal, which are respectively connected to a source and a drain thereof, in response to the back bias voltage VBB received from a gate thereof.

An operation of the voltage detector 502 in accordance with the embodiment will be described below based on the above configuration.

Based on a resistance of the first PMOS transistor P1 which is determined by the ground voltage VSS, a voltage level on the connection node DET is determined in response to a resistance of the second PMOS transistor P2 and a resistance of the third PMOS transistor P3. The resistance of the second PMOS transistor P2 changes according to the comparison voltage CP_OUT and the resistance of the third PMOS transistor changes according to the back bias voltage VBB.

The voltage on the connection node DET is driven to a logic high or low level based on a logic threshold voltage level of the inverter INV and outputted as the detecting signal VBB_DET.

For example, when the comparison voltage CP_OUT increases due to the increase of the off leakage current I_IOFF, the resistance of the second PMOS transistor P2 increases. Accordingly, the voltage on the connection node DET increases.

At this time, in case where the back bias voltage VBB increases or decreases in a negative region which is lower than the ground voltage VSS, the resistance of the third PMOS transistor P3 also changes. Accordingly, the voltage on the connection node DET increases or decreases based on the voltage level increased by the second PMOS transistor P2.

On the contrary, when the comparison voltage CP_OUT decreases due to the increase of the junction leakage current I_LEAK, the resistance of the second PMOS transistor P2 decreases. Accordingly, the voltage on the connection node DET decreases.

At this time, in case where the back bias voltage VBB increases or decreases in a negative region which is lower than the ground voltage VSS, the resistance of the third PMOS transistor P3 also changes. Accordingly, the voltage on the connection node DET increases or decreases based on the voltage level decreased by the second PMOS transistor P2.

According as the level of the comparison voltage CP_OUT changes, the level of the voltage on the connection node DET changes in different regions. And then, if the voltage on the connection node DET becomes lower than the logic threshold voltage level of the inverter INV, the inverter INV outputs the detecting signal VBB_DET in a logic high level. On the contrary, if the voltage on the connection node DET becomes high than the logic threshold voltage level of the inverter INV, the inverter INV outputs the detecting signal VBB_DET in a logic low level.

Accordingly, the voltage detector 502 in the disclosed embodiment determines the target level of the back bias voltage VBB to be detected once by adjusting sizes of the first and third PMOS transistors P1 and P3. The voltage detector 502 adjusts a basic target level determined by the first and third PMOS transistors P1 and P3 while the resistance of the second PMOS transistor changes in response to the comparison voltage CP_OUT.

When the target level of the back bias voltage VBB to be detected is determined, the sizes of the first and third PMOS transistors P1 and P3 are controlled to make a transition of the logic level of the detecting signal VBB_DET at the timing corresponding to the determined target level. And then, according to variation width of the target level, which changes by the leakage current of the DRAM, the resistance of the second PMOS transistor P2 is adjusted to thereby control a transition timing of the detecting signal VBB_DET in response to the leakage current of the DRAM.

FIG. 9 is a graph illustrating the interrelation between a back bias voltage and a leakage current in the DRAM in accordance with an embodiment of the invention.

Referring to FIG. 9, in accordance with the invention, the total current I_TOTAL of the DRAM is minimized by adjusting the target level of the back bias voltage VBB according to variations of the off leakage current I_IOFF and the junction leakage current I_LEAK of the DRAM.

For example, when the back bias voltage VBB increases in a negative direction of which level is lower than the ground voltage VSS, the off leakage current I_IOFF of the DRAM decreases following a curve ① and the junction leakage current I_LEAK of the DRAM increases following a curve ②. Accordingly, the level of the back bias voltage is determined at −0.8 voltage level to thereby minimize the amount of the total leakage current I_TOTAL.

At this time, in case that the off leakage current I_IOFF decreases following a curve ③ due to differences on the process but the junction leakage current I_LEAK continues to increase following the curve ②, the level of back bias voltage VBB can be adjusted from −0.8 voltage level to −0.9 voltage level to minimize the amount of the total leakage current I_TOTAL.

On the contrary, in case that the junction leakage current I_LEAK increases following the curve ④ due to differences on the process but the off leakage current I_IOFF continues to decrease following a curve ①, the level of back bias voltage VBB can be adjusted from −0.8 voltage level to −0.7 voltage level to minimize the amount of the total leakage current I_TOTAL.

Accordingly, the amount of the total leakage current I_TOTAL may be always maintained to a minimum level by adjusting the back bias voltage VBB.

As described above, in accordance with the embodiment of the invention, the amount of the total leakage current of the DRAM can be minimized by adjusting the target level of the back bias voltage VBB according to the detecting result of the off and junction leakage currents even if a variation characteristic of the off and junction leakage currents changes due to the differences on the process.

Accordingly, in a plurality of DRAMs having different leakage current characteristics due to the difference of PVT, the total leakage current can be minimized in each DRAM. It is prevented that a refresh period is reduced due to the leakage current of DRAM.

With respect to the invention described above, various change and modifications may be made without departing from the spirit and scope of the invention.

For example, while the leakage current is detected and the internal voltage of the DRAM is generated according to the detection result in the disclosed embodiment, the invention can be applied to a semiconductor memory device.

In addition, while the level of the back bias voltage VBB is adjusted according to the detection result in the disclosed embodiment, other internal voltages of the DRAM as well as the back bias voltage VBB may be applied.

It is also embodied that the leakage current generated in the cell array is detected in the disclosed embodiment. However, a test cell array may be used to detect the leakage current. In addition, it should be noted that the logic gates and transistors used in the above embodiment may be implemented at different locations and in different types based on the polarities of input signals.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a leakage current detector configured to detect a leakage current of a cell array; and
   a back bias voltage generator configured to change a target level according to an amount of the leakage current to generate a back bias detection signal, and to generate a back bias voltage in response to the back bias detection signal.

2. The semiconductor memory device of claim 1, wherein the leakage current detector includes:
   an off leakage current detector configured to detect off leakage currents generated in the cell array and to generate a first detection voltage corresponding to a detection result;
   a junction leakage current detector configured to detect junction leakage currents generated in the cell array and to generate a second detection voltage corresponding to a detection result; and
   a voltage comparator configured to compare the first detection voltage with the second detection voltage to generate a comparison voltage.

3. The semiconductor memory device of claim 2, wherein the off leakage current detector includes:
   an off leakage voltage generating unit configured to generate an off leakage voltage having a level corresponding to a sum of off leakage currents generated in a plurality of transistors of the cell array; and
   a buffering unit configured to output the first detection voltage by buffering the off leakage voltage.

4. The semiconductor memory device of claim 3, wherein the off leakage voltage generating unit includes a resistor connected between a detection node and a ground voltage terminal and is configured to output the off leakage voltage through the detection node in a standby mode, wherein the detection node is connected to sources of the plurality of transistors.

5. The semiconductor memory device of claim 2, wherein the second detection voltage has a level that corresponds to a sum of junction leakage currents generated in a plurality of transistors of the cell array.

6. The semiconductor memory device of claim 5, wherein the junction leakage current detector includes a resistor connected between a detection node and a core voltage terminal and outputs the second detection voltage through the detection node in a standby mode, wherein the detection node is connected to drains of the plurality of transistors.

7. The semiconductor memory device of claim 2, wherein the voltage comparator decreases a level of the comparison voltage according to a level difference when the first detection voltage becomes greater than the second detection voltage.

8. The semiconductor memory device of claim 2, wherein the voltage comparator increases a level of the comparison voltage according to a level difference when the first detection voltage becomes lower than the second detection voltage.

9. The semiconductor memory device of claim 2, wherein the back bias voltage generator includes:
   a voltage detector configured to detect the back bias voltage by changing the target level according to a level of the comparison voltage and to generate the back bias detection signal; and
   a voltage generator configured to generate the back bias voltage in response to the back bias detection signal.

10. The semiconductor memory device of claim 9, wherein the voltage generator includes:

an oscillating unit for generating an oscillating signal toggled with a predetermined period according to the back bias detection signal; and a pumping unit for generating the back bias voltage by pumping charges in response to the oscillating signal.

11. The semiconductor memory device of claim 1, wherein the cell array includes a test cell array.

12. A semiconductor memory device, comprising:

an off leakage current detector configured to detect off leakage currents generated in a cell array and to generate a first detection voltage corresponding to a detection result;

a junction leakage current detector configured to detect junction leakage currents generated in the cell array and to generate a second detection voltage corresponding to a detection result;

a voltage comparator configured to compare the first detection voltage with the second detection voltage; and a back bias voltage generator for generating a back bias voltage with a target level changed according to a comparison result of the voltage comparator.

13. The semiconductor memory device of claim 12, wherein the off leakage current detector includes:

an off leakage voltage generating unit for generating an off leakage voltage with a level corresponding to a sum of off leakage currents generated in a plurality of transistors of the cell array; and a buffering unit for outputting the first detection voltage by buffering the off leakage voltage.

14. The semiconductor memory device of claim 13, wherein the off leakage voltage generating unit includes a resistor connected between a detection node and a ground voltage terminal and outputs the off leakage voltage through the detection node in a standby mode, wherein the detection node is connected to sources of the plurality of transistors.

15. The semiconductor memory device of claim 12, wherein the second detection voltage has a level that corresponds to a sum of junction leakage currents generated in a plurality of transistors of the cell array.

16. The semiconductor memory device of claim 15, wherein the junction leakage current detector includes a resistor connected between a detection node and a core voltage terminal and outputs the second detection voltage through the detection node in a standby mode, wherein the detection node is connected to drains of the plurality of transistors.

17. The semiconductor memory device of claim 12, wherein the voltage comparator is configured to output a comparison voltage having a level that decreases when the first detection voltage becomes greater than the second detection voltage and increases when the first detection voltage becomes lower than the second detection voltage by a level difference.

18. The semiconductor memory device of claim 12, wherein the back bias voltage generator includes:

a voltage detector, configured to detect the back bias voltage by using the target level, and outputting a detecting signal; and a voltage generator for generating the back bias voltage in response to the detecting signal.

19. The semiconductor memory device of claim 12, wherein the cell array includes a test cell array.

20. A method for driving a semiconductor memory device, comprising:

detecting an off leakage current and a junction leakage current generated in a cell array; and comparing a detection result of the off leakage current and a detection result of the function leakage current to generate a comparison result; and generating a back bias voltage using a target level changed according to the comparison result.

21. The method of claim 20, wherein detecting the off leakage current and the junction leakage current includes:

generating a first detection voltage corresponding to the detection result of the off leakage current generated in the cell array;

generating a second detection voltage corresponding to the detection result of the junction leakage current generated in the cell array; and generating a comparison voltage corresponding to a comparison result of comparing the first detection voltage with the second detection voltage.

22. The method of claim 21, wherein generating the first detection voltage includes:

generating an off leakage voltage having a level that corresponds to a sum of off leakage currents generated in a plurality of cell transistors of the cell array respectively; and outputting the first detection voltage by buffering the off leakage voltage.

23. The method of claim 21, wherein a level of the second detection voltage corresponds to a sum of junction leakage currents generated in a plurality of cell transistors of the cell array.

24. The method of claim 21, wherein generating the comparison voltage includes:

decreasing a level of the comparison voltage according to a first level difference when the first detection voltage becomes greater than the second detection voltage; and increasing the level of the comparison voltage according to a second level difference when the first detection voltage becomes lower than the second detection voltage.

25. The method of claim 20, wherein generating the back bias voltage includes:

detecting the back bias voltage by changing the target level according to the comparison result;

generating an oscillating signal toggled with a predetermined period according to a detection result of the back bias voltage; and generating the back bias voltage by pumping charges in response to the oscillating signal.

* * * * *

UNITED STATES PATENT AND TRADEMARK OFFICE
CERTIFICATE OF CORRECTION

PATENT NO. : 7,835,198 B2  
APPLICATION NO. : 11/966779  
DATED : November 16, 2010  
INVENTOR(S) : Choi et al.

Page 1 of 1

It is certified that error appears in the above-identified patent and that said Letters Patent is hereby corrected as shown below:

On the Title Page  
Change FOREIGN PATENT DOCUMENTS portion of Item (56) for References Cited as follows:

FOREIGN PATENT DOCUMENTS Should read,

| | | |
|---|---|---|
| JP | 05205465 | 8/1993 |
| JP | 08-203269 | 8/1996 |
| JP | 2006-190435 | 7/2006 |
| JP | 2006-190436 | 7/2006 |
| KR | 100193103 | 2/1999 |
| KR | 1020000008777 | 2/2000 |
| KR | 100263529 | 5/2000 |
| KR | 1020000042478 | 7/2000 |
| KR | 10-2000-0075605 | 12/2000 |
| KR | 1020010004017 | 1/2001 |
| KR | 1020010005268 | 1/2001 |
| KR | 1020030002650 | 1/2003 |
| KR | 10-2006-0007758 | 1/2006 |

Signed and Sealed this  
Twenty-eighth Day of December, 2010

David J. Kappos  
*Director of the United States Patent and Trademark Office*